United States Patent [19]
Ross et al.

[11] Patent Number: 5,307,079
[45] Date of Patent: Apr. 26, 1994

[54] SHORT PULSE MICROWAVE SOURCE WITH A HIGH PRF AND LOW POWER DRAIN

[75] Inventors: Gerald F. Ross, Longboat Key, Fla.; Richard M. Mara, Tewskbury; Kenneth W. Rollins, North Reading, both of Mass.

[73] Assignee: Anro Engineering, Inc., Lexington, Mass.

[21] Appl. No.: 7,332

[22] Filed: Jan. 21, 1993

Related U.S. Application Data

[62] Division of Ser. No. 715,546, Jun. 14, 1991, Pat. No. 5,216,695.

[51] Int. Cl.⁵ .............................................. H01Q 9/16
[52] U.S. Cl. ..................................... 343/822; 343/821
[58] Field of Search ............... 343/820, 821, 822, 793; 333/25, 26

[56] References Cited

U.S. PATENT DOCUMENTS

| | | | |
|---|---|---|---|
| 3,922,683 | 11/1975 | Kumpebeck | 343/822 |
| 4,587,525 | 5/1986 | Parsons et al. | 343/822 |
| 4,800,393 | 1/1989 | Edward et al. | 343/829 |

*Primary Examiner*—Donald Hajec
*Assistant Examiner*—Tan Ho

[57] ABSTRACT

This invention describes a high voltage, very short pulse, microwave radiating source using low-cost components, and capable of operating at high pulse repetition frequencies (prf). The source is activated by an ordinary video trigger commensurate with driving TTL logic. A trigger will cause a chain of N (where N may be 12 or greater) avalanche transistors connected in a Marx generator configuration to threshold resulting in a 1,200 volt or greater baseband pulse having a rise time of less than 100 ps and a duration of about 3 ns driving the input port of a dipole antenna. The dipole is excited by a balun. This invention achieves very short pulse duration broadband microwave radiation at pulse repetition frequencies as high as 30 kHz or greater.

3 Claims, 5 Drawing Sheets

SHORT PULSE MICROWAVE SOURCE WITH A HIGH PRF AND LOW POWER DRAIN

REFERENCED APPLICATION

This application is a division of application Ser. No. 07/715,546, filed on Jun. 14, 1991, now U.S. Pat. No. 5,216,695.

U.S. application Ser. No. 07/451,430, now U.S. Pat. No. 5,084,706, entitled "Synchronization Of Very Short Pulse Microwave Signals For Array Applications" invented by Gerald F. Ross and Richard M. Mara and having the same assignee as the instant application.

BACKGROUND OF THE INVENTION

1. Field of the Invention

This invention relates generally to the field of radar transmitters and more particularly to short pulse generation and radiation and time domain electromagnetics.

2. Description of the Prior Art

Radar Systems have a greater range and range resolution when the transmitted signal has a high peak power and short pulse duration. Conventional designs use a Marx generator to develop these signals. However, these designs have a limited pulse repetition frequency and pulse duration, and provide reduced high peak power. However, modifications to the conventional Marx generator eliminate these deficiencies. Therefore, a detailed description of the Marx generator is in order to better understand the invention.

Avalanche transistors were designed into the transmitter system to accomplish this need for improved performance at a very low cost. Previous attempts to increase the pulse repetition frequency (prf) of the source have been limited by avalanche transistor dissipation and power supply drain. As an example, the Marx generator configuration consisting of avalanche transistor sources permits one to charge a bank of capacitors in parallel from a low battery voltage and then discharge them in series creating a high voltage pulse. The Marx generator configuration is described in a text written by Miller, et al, entitled, "*Time domain Measurements in Electromagnetics*", Chapter 4, pp. 100-101, Van Nostrand Reinhold Company, N.Y., 1986.

To significantly increase the prf of the source beyond what has been achieved by other investigators, it is important to recognize the sources of current drain and power dissipation in the system. At first inspection, it appears that the only source of current drain from the dc supply is due to the charging of the coupling capacitors Cn of the Marx generator. Note that in the Marx generator design the capacitors are charged in parallel, and that the dissipation limitations of the avalanche transistors (e.g., an RS 3500 or the equivalent) determine the maximum prf. It can be shown mathematically that the average current during the charge cycle is determined only by the capacitor Cn. The two charging resistors R should be made as small as possible to ensure recharging capacitor Cn quickly for achieving a high prf. Since these resistors directly load the short pulse that is produced during the avalanche mode (e.g., they are effectively in parallel with an avalanche diode and balun circuit) they cannot be made too low in value. For example, in a 12 stage avalanche transistor Marx generator, where R=6.8K, there are effectively 24-6.8K resistors in parallel constituting about a 280 ohm load or the driving point impedance of the balun when exciting an antenna which results in a reduction of the high voltage signal. The decrease in output voltage can only be compensated for by increasing the number of avalanche transistor stages which, in turn, further increases the loading resulting in a vanishing small gain.

Other investigators have generated only baseband or video pulses at repetition frequencies of 1 kHz or less using this type of generator.

OBJECTS OF THE INVENTION

Accordingly, it is a primary object of the invention to have an improved radar system.

It is an object of the invention to have an improved radar transmitter.

It is an object of the invention to have an improved radar transmitter radiating a higher pulse repetition frequency.

It is another object of the invention to have an improved radar transmitter radiating a very short duration microwave pulse with high peak power.

It is still another object of the invention to achieve high peak power, short pulse microwave radiation, using conventional components at the lowest possible cost.

SUMMARY OF THE INVENTION

The above objects and advantages are achieved in a preferred embodiment of the present invention. According to the preferred embodiment, this invention describes a high voltage, very short pulse, microwave radiating source using low-cost components, and capable of operating at high pulse repetition frequencies. The source is activated by an ordinary video trigger commensurate with driving TTL logic, for example, a 2 volt, 10 ns rise time positive trigger will cause a chain of N (where N may be 12 or greater) avalanche transistors connected in a Marx generator configuration to threshold resulting in a 1,200 volt or greater baseband pulse having a rise time of less than 100 ps and a duration of about 3 ns driving the input port of a dipole antenna. The dipole is excited by a balun. The balun is a matching device that connects a coaxial to a two-wire line. The Marx generator configuration permits one to charge a bank of capacitors in parallel from a low battery voltage and then discharge them in series creating a high voltage pulse. The circuit assures that the capacitors are charged during a short interval before application of the main avalanche trigger, and the power supply is disconnected just prior to triggering the modified Marx generator.

The high voltage baseband (or video) pulse produced is used directly to excite a microwave antenna. The result is the radiation of the impulse response of a balun-antenna cavity. Measurements taken produce less than a 1 ns duration radiated pulse having a nominal center frequency of 2.5 GHz. The centroid of the spectrum of the radiated pulse can be shifted up or down in frequency by redesigning the balun-antenna cavity. One of the key features of the instant invention is the ability to achieve this short pulse duration broadband microwave radiation at pulse repetition frequencies as high as 30 kHz or greater.

DESCRIPTION OF THE PREFERRED EMBODIMENT

Figure 1:
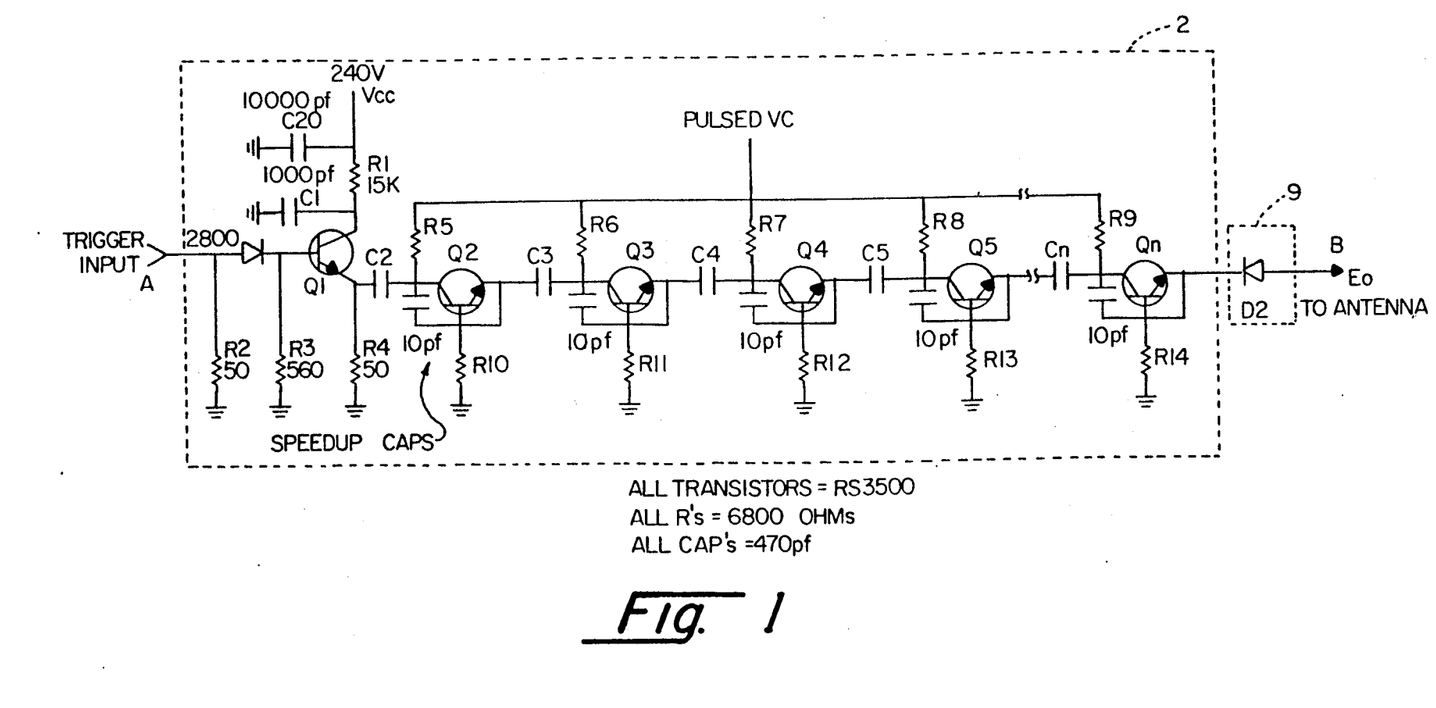
FIG. 1 is a circuit diagram of a modified Marx generator configuration.

A diagram of a conventional Marx generator 2 driving a modified balun and antenna is shown in FIG. 1. An advantage of using the Marx generator concept is to achieve a large output pulse at port B while avoiding the use of a high voltage dc power supply, Vcc. In the absence of a trigger pulse at port A, each of the capacitors, C3, C4, ... Cn charge to Vcc through the resistor pairs R6, R11; R7, R12; RM+5; ..., respectively. A capacitor C2 charges through a resistor R5 and the emitter resistor of a trigger avalanche transistor Q1. A capacitor C1 charges through a resistor R1 and provides the source of charge for a transistor Q1. After a capacitor C1 is fully charged and a sufficiently large positive trigger is applied to Port A, transistor Q1 avalanches discharging capacitor C1, essentially, into a 50 ohm load R4. This voltage is then in series with the voltage already across capacitor C2 causing transistor Q2 to over-voltage and avalanche. This larger voltage, in turn, is instantaneously in series with capacitor C3 causing transistor Q3 to over-voltage and avalanche. The chain of events continue until each of the tandem connected avalanche transistors, Q4, Q5, ... Qn rapidly break down. When the avalanche transistor breaks down the collector, base, and emitter junctions, virtually, short circuit placing the high voltage pulse traveling down the line incident on an avalanche diode D2 part of a balun 9, essentially in series with resistor R4 and the antenna load at Part B. The 1-2, nanosecond rise time high voltage (e.g., 1200 volt) pulse produced by, for example, a 12 stage Marx generator chain firing causes the back biased diode D2 to go into avalanche breakdown mode speeding up the transition to 100 ps or less. Small 10 pf capacitors C, are placed between the base and collector junctions to help speed-up the basic high voltage baseband pulse produced by the Marx Generator. Diode D1 prevents any kickout pulse from returning to the trigger source. Resistor R2 terminates the trigger source, while resistor R3 provides a dc return for the base circuit of Q1. A capacitor C20 is used to bypass the power supply. When triggered by a 2 volt, 100 ns duration positive pulse, a 1200 volt, 1.5 ns rise time baseband pulse is delivered to a coaxial balun having a driving point impedance (resistance) of 50 ohms, resulting in a peak current of 24 amperes. This is described by S. Silver, in *"Microwave Antenna Theory and Design, "* published in Section 8, pp. 246-247, MIT Radiation Laboratory Series, Boston Technical Lithographies, Inc., 1963.

Figure 2A:
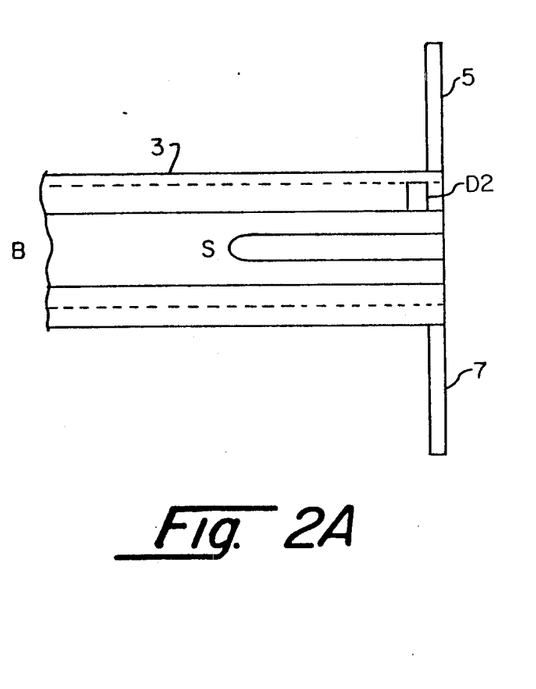
FIGS. 2A and 2B show the balun-dipole mechanical configuration.
Figure 2B:
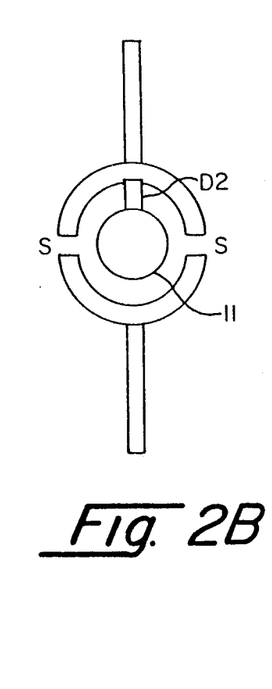

The purpose of the balun 9 is to match the unbalanced coaxial line to the balanced dipole antenna. The modified balun device 9 is shown in FIG. 2 where the conventional "post" is replaced by the avalanche diode D2 of FIG. 1. The avalanche diode D2 is selected to avalanche at a critical threshold voltage generating about 1,000 volts, 100 ps rise time pulse. This high voltage, very fast rise time, pulse is directly incident on the input port of a dipole element collocated with the avalanche diode (i.e., "the post"). The balun 9 behaves properly as a microwave matching element during the pulse avalanche mode because diode D2 is a virtual short circuit when the avalanche diode is triggered having the same electrical properties of the post P.

Figure 3:
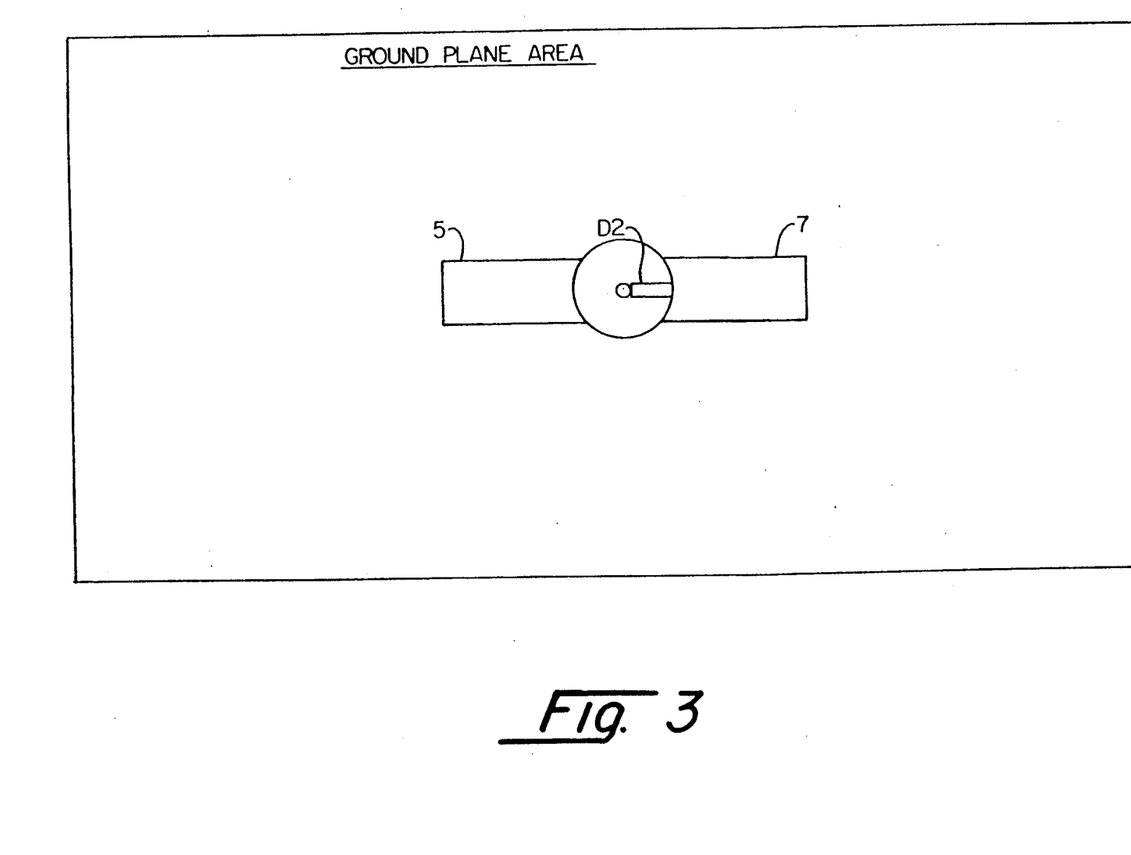
FIG. 3 shows the balun dipole mounted above a groundplane.
Figure 4:
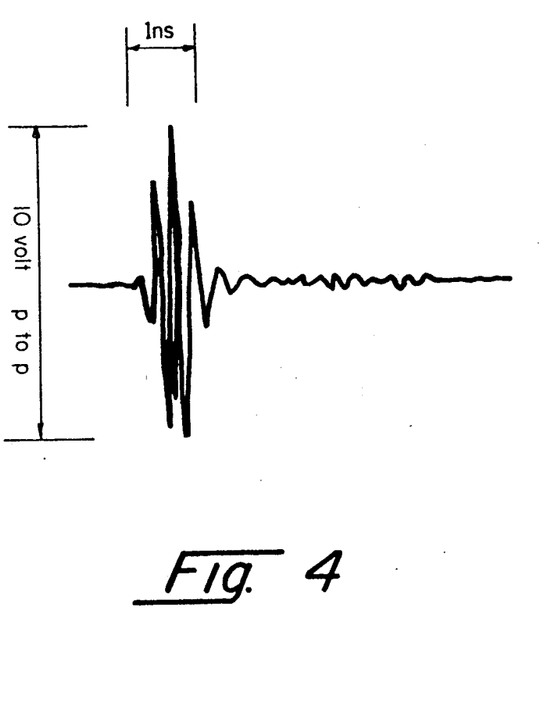
FIG. 4 shows the wave shape of an output S-band pulsed signal received at 1 meter.

The dipole 5 and 7 is placed above a flat plate to ensure radiation in the forward direction only as shown in FIG. 3. It may also be mounted within a corner reflector for greater gain at the cost of additional dispersion or for that matter other appropriately designed reflecting surfaces. The signal radiated into the far field as shown on a sampling oscilloscope is presented in FIG. 4. The signal is viewed by a dipole-corner reflector receiving antenna (with an actual post substituted for the avalanche diode in the balun) and is connected directly to a Hewlett-Packard model #181A/1811A sampling oscilloscope located at one meter from the source. The response contains only several cycles of S-band microwave energy even with the additional dispersion introduced by the receiving antenna as shown in FIG. 4.

The slots S shown in FIG. 2 are generally set to be equal to a quarter of a wavelength in length at the nominal center frequency of the pulse burst as are the element lengths (or wings) 5 and 7 which form the dipole. Both wings of the dipole are mounted on the outer conductor of the coaxial fixture 3 in which a pair of slots S are milled in plane normal to the dipole axis; the slot width is made much less than a wavelength. The inner conductor 11 of the coaxial feed line is short circuited to the outer conductor on one side of diode D2 as shown in FIG. 2.

Previous attempts to increase the prf of the source have been limited by avalanche transistor dissipation and power supply drain. To significantly increase the prf of the source beyond what has been achieved by other investigators, it is important to recognize the sources of current drain in the system.

At first inspection, it appears that the only source of current drain from the dc supply is due to the charging of the capacitors, C2, C3, C4 .... Cn denoted as 470 pf in FIG. 1. Note that in the Marx generator design the capacitors are charged in parallel, and that the dissipation limitations of the avalanche transistors Q1, Q2, Q3, ... Qn (e.g., a RS 3500 or the equivalent) determine the maximum prf. It can be shown mathematically that the average current during the charge cycle is determined only by the capacitor, Cn. The two charging resistor pairs (R5, R10; R6, R11; R7, R12; etc.), shown as 6.8K in FIG. 1 should be made as small as possible to ensure recharging Cn, quickly for achieving a high prf. Since these resistors directly load the short pulse that is produced during the avalanche mode (e.g., they are effectively in parallel with the avalanche diode and balun circuit) they cannot be made too low in value. For example, in a 12 transistor Marx generator, there are effectively 24-6.8K resistors in parallel constituting about a 280 ohm load. This load is in parallel with the 50 ohm driving point impedance of the balun which results in a reduction of the high voltage signal incident on the avalanche diode. The decrease in output voltage can only be compensated for by increasing the number of avalanche transistor stages which, in turn, further increases the loading resulting in a vanishing small gain.

It was found, by experiment, that a major cause of power drain from the source and dissipation was due to the stored charge properties of the avalanche transistors themselves after they are activated. For example, the avalanche transistors continue to behave as a virtual short circuit for as much as 5 microseconds after it fires causing a large overage current to flow through the two 6.8K resistors. This leakage current is comparable to the charging current itself. In addition, when the avalanche transistor is "off" its static resistance is only 100K ohms (i.e., it is not an open circuit). If the supply voltage, for example, is 220 volts, then each avalanche transistor draws about 2.2 ma from the supply or a total of an additional 26 ma, statically, which is also comparable to the average capacitor charging current and directly affects avalanche transistor dissipation and limits the prf to a kHz or less.

Figure 5A:
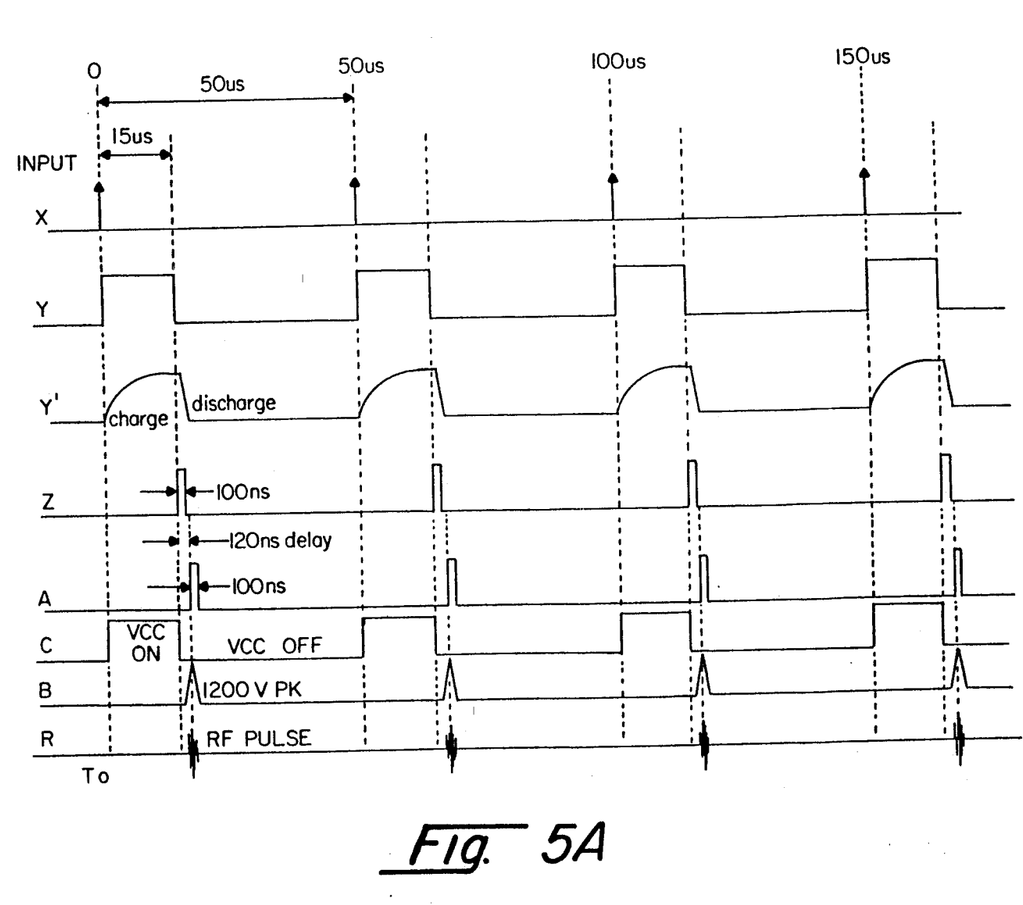
FIG. 5a is a timing chart gating sequence.
Figure 5B:
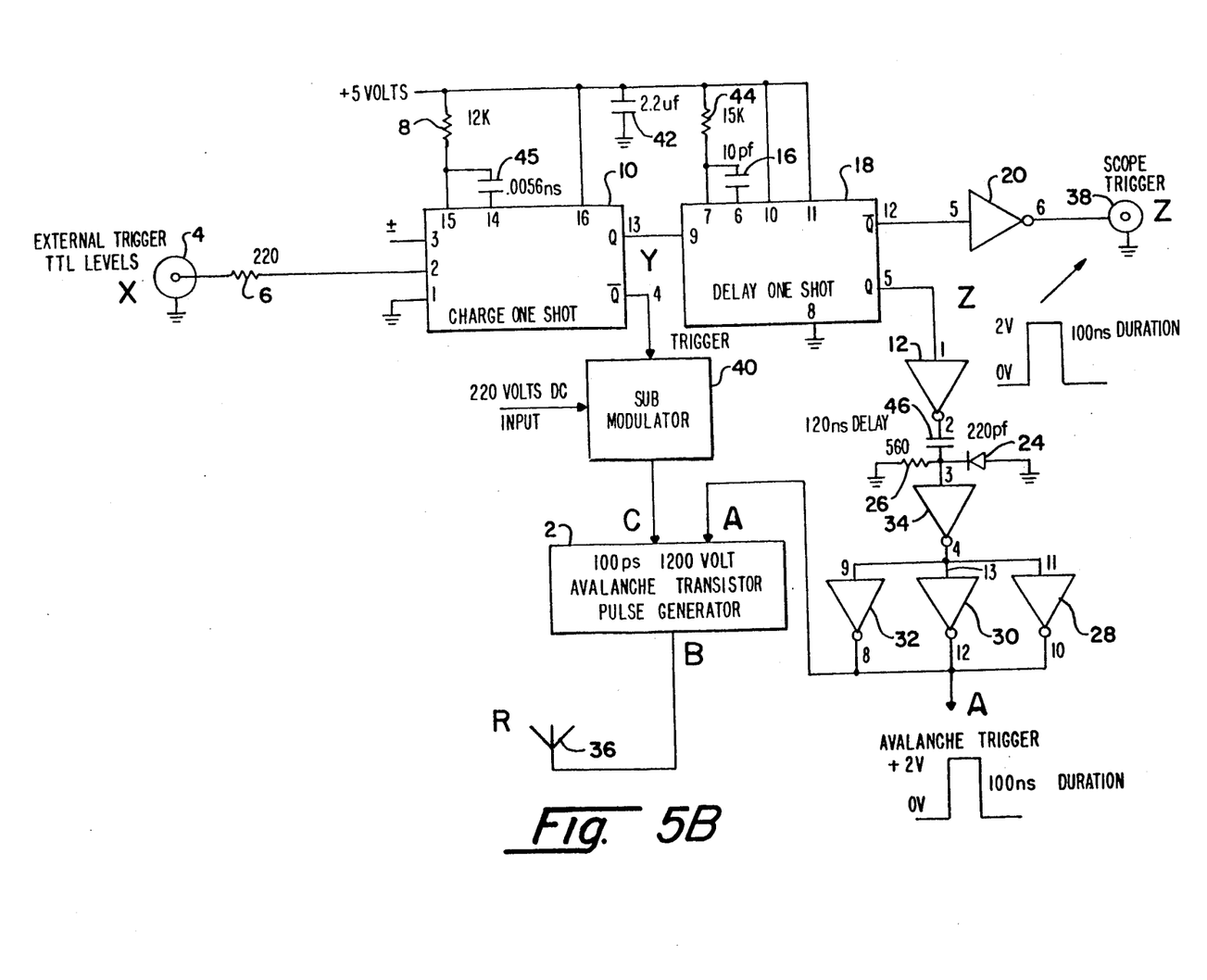
FIG. 5b is a block diagram of the S-band short pulse source.

To reduce dissipation significantly, the subject invention uses the gating scheme shown in FIG. 5. Briefly, the circuit assures that the capacitors are charged during a short interval *before* application of the main avalanche trigger. And, the power supply is *disconnected* just prior to triggering the Marx generator. In this manner, the shorted avalanche transistors which continues for about 5 microseconds after firing causes no drain on the supply and dissipation within the transistors because the battery is *disconnected*, (e.g., the capacitors discharge in nanoseconds into the antenna and there are no other sources of energy in the circuit). The leakage current and accompanying dissipation is reduced substantially because the supply is only connected when the capacitors charge (e.g., a fraction of the pulse repetition period).

An external trigger is applied at terminal 4 in series with a current limiting resistor 6. The trigger is applied to two monostable or one shot multivibrator networks 10 and 18 respectively, creating the gating sequency shown in FIG. 5a.

Referring to FIGS. 5a and 5b, one-shot 10 produces the pulse train Y when triggered by external trigger X. Assuming a pulse repetition period of 50 microseconds, the gate width of pulse train Y is set to 15 microseconds by the resistor 8 and the capacitor 45. This gate width of pulse train Y modulates the Vcc supply via a Field Effect Transistor (FET); i.e., a submodulator 40. The output signal C of submodulator 40 turns the power to the avalanche transistor generator 2, on and off. When output signal C is applied to generator 2, the capacitors Cn fully charge through the resistors Rm, Rm+5 (FIG. 1) and are shown as wave shape Y'. The capacitors Cn remain charged for a short time *after* the power is removed because there is virtually no discharge path.

The tailing edge of its waveform Y triggers one-shot 18 which generates a 100 nanosecond duration pulse Z. The pulse width is determined by a resistor 44 between pin 7 and +5 volts and a capacitor 16 across pins 6 and 7 of one-shot 18. A capacitor 42 is used for conventional bypassing of the +5 volt power supply. Pulse Z triggers a sampling oscilloscope at scope trigger 36. Pulse Z is also fed through a 120 nanosecond delay network made up of an inverter 12, a capacitor 46, a resistor 26, a diode 24, and an invertor 34. The inverters 12 and 34 are also used for isolation to produce the main drive transmitter pulse (trigger) A for input to generator 2. The trigger A is fed via drivers 28, 30 and 32 in parallel to create a low source impedance. When trigger A is applied to the avalanche generator 2, a 1200 volt, 100 picosecond rise time pulse B is generated. Pulse B excites antenna 36 producing them microwave S-band pulse burst R.

To estimate the current drain, assume a battery voltage of 220 volts and a pulse repetition period of 50 microseconds, the FET 40 off resistance of 1M ohms and a charge time of about 15 microseconds, then the leakage current is approximately given by:

$$i\text{ leakage}_A = 12 \times \frac{220}{2(6.8) + 1{,}000 + 100} \times \frac{35}{50} = 1.6ma \quad (1)$$

During charge, the FET is on and the avalanche transistor is off, then $$i\text{ leakage}_B = 12 \times \frac{220}{2(6.8) + 100} \times \frac{15}{50} = 6.9ma \quad (2)$$

In addition to the leakage current, we have the normal charge current of $$i_c = 12 \times \frac{1}{50} \int_0^{50} e^{-t/2(6.8)(470)} dt = 23ma \quad (3)$$

Thus, the total current, by superposition, is approximately $$1.6 + 6.9 + 23 \sim 30 \text{ ma} \quad (4)$$

Had the FET, with the subject invention's special gating features not been employed, the current drain would have been $$i\text{ leakage} = \quad (5)$$
$$12 \times \frac{220}{2(6.8) + 100} = 23.2ma\text{(avalanche transistor off)}$$

$$i\text{ stored charge} = \quad (6)$$
$$12 \times \frac{220}{2(6.8)} \times \frac{5}{50} =$$
$$19.4ma\text{(avalanche transistor on for 5 additional microseconds)}$$

$$i\text{ charge} = \quad (7)$$
$$12 \times \frac{1}{50} \int_0^{50} e^{-5/2(6.8)(470)} dt = 23ma\text{(normal charge current)}$$

For a total current, by superposition, of $$23.2 + 19.4 + 23 = 65.6 \text{ ma} \quad (8)$$

This factor of 65.6/30 = 2.19 reduction in current corresponds to a factor of about 5 saving in dissipation (note: dissipation is a function of $i^2$).

In summary, the above calculation shows, by example, why the instant invention permits operation at a higher prf than previously achieved. The numbers become more dramatic if, for example, a higher "off" resistance FET is used for gating off the supply and the required charge time is further reduced by the use of active circuits. Or the dissipation is farther reduced if the prf is lowered; for example, to 10 kHz.

Also, the use of a slotted balun and dipole antenna configuration replacing the conventional post location by an avalanche diode (e.g., a type IN 5400 or the equivalent) permits radiation of a very fast rise time pulse (i.e., by producing a good "match") and high peak power with significant radiation at S-band of 10 volts peak to peak one meter from the source as measured on the referenced receive element (e.g., 2.5 GHz). The amplitude of the radiated pulse depends on the snap speed of the diode and the frequency to which the balun-dipole configuration is tuned. It should be possible to radiate using a simple dipole element up to 5 GHz. By placing the avalanche diode D2, for example, in a waveguide, radiation at X-band is feasible, but at reduced field strength.

It is also possible to use an array of these sources synchronized with the referenced application to focus short pulse microwave energy in the far field and steer the beam in space by appropriately controlling the time delay of the trigger to each Marx generator described in this application. The instant invention then becomes an "element in an array and provides the basis for a very low-cost scheme for beam formation and steering.

While the invention has been shown and described with reference to the preferred embodiment thereof, it will be understood by those skilled in the art that the above and other changes in form and detail may be made therein without departing from the spirit and scope of the invention.

what is claimed is:

1. Balun apparatus for matching a coaxial line to a balanced dipole and providing a wideband matching circuit to minimize microwave pulse packet dispersion comprising:

an avalanche diode to provide a step function transition necessary for efficient short pulse radiation;

an elongated, generally cylindrical, outer conductor having an inner diameter and an outer diameter about a longitudinal axis, said outer conductor having two slots parallel to and opposite each other and parallel to said longitudinal axis, each of said slots having an opening at a terminal end and each having a length of one quarter wave length at a nominal spectral centroid of the transmission, a centroid frequency may be varied by simply changing the antenna balun dimensions;

an elongated, generally cylindrical, inner conductor having an outer diameter smaller than said inner diameter of said outer conductor, said inner conductor coaxial to said outer conductor, said avalanche diode being directly connected between said inner conductor at said terminal end and said outer conductor at said terminal end, equally distant between said slots; and a dipole connected to said outer conductor at said terminal end midway between said slots and connected to said avalanche diode for filtering a slower nanosecond rise time excitation pulse from a fast radiated signal caused by said avalanche diode.

2. A method of generating a balun apparatus to be responsive to a predetermined nominal ultra-wideband spectral centroid microwave pulse packet transmission including the steps of:

A. forming two slots in an elongated, generally cylindrical, outer conductor, parallel to and opposite each other and parallel to a longitudinal axis, each of said slots having an opening at a terminal end and each having a length of one quarter wave length of the predetermined nominal spectral centroid of the transmission;

B. forming a dipole to a length equal to the length of one quarter wave length of the predetermined nominal spectral centroid of the transmission;

C. mounting an elongated, generally cylindrical, inner conductor having an outer diameter smaller than an inner diameter of said outer conductor coaxial to and within the outer conductor;

D. directly connecting an avalanche diode between the inner conductor at the terminal end and the outer conductor, the avalanche diode being connected to the outer conductor at the terminal end by a pigtail acting as a post, and equally distant between the slots;

E. connecting the dipole to the outer conductor at the terminal end parallel to the axis and equally distant between the slots;

F. mounting the outer conductor to a ground plane so that the longitudinal axis is perpendicular to the ground plane with the terminal end furthest from the ground plane so that the dipole is a distance of one quarter wave length above the ground plane.

3. The method of claim 2 wherein the predetermined nominal spectral centroid of transmission is typically between 1 and 3 GHz.

* * * * *

UNITED STATES PATENT AND TRADEMARK OFFICE
CERTIFICATE OF CORRECTION

PATENT NO. : 5,307,079
DATED : April 26, 1994
INVENTOR(S) : Ross, G.

It is certified that error appears in the above-indentified patent and that said Letters Patent is hereby corrected as shown below:

On the title page: Item [75] Inventor should read --Gerald F. Ross --.

Signed and Sealed this

Eleventh Day of October, 1994

Attest:

BRUCE LEHMAN

Attesting Officer     Commissioner of Patents and Trademarks